United States Patent
Kunikiyo

(12) 
(10) Patent No.: US 6,285,079 B1
(45) Date of Patent: Sep. 4, 2001

(54) SEMICONDUCTOR DEVICE EMPLOYING GRID ARRAY ELECTRODES AND COMPACT CHIP-SIZE PACKAGE

(75) Inventor: Tatsuya Kunikiyo, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/193,247

(22) Filed: Nov. 17, 1998

(30) Foreign Application Priority Data

Jun. 2, 1998 (JP) .................................................. 10-153206

(51) Int. Cl.$^7$ .................................................. H01L 23/48
(52) U.S. Cl. ............................................. 257/737; 257/778
(58) Field of Search ..................................... 257/710, 738, 257/778, 780, 781, 783, 737, 697

(56) References Cited

U.S. PATENT DOCUMENTS

| | | | |
|---|---|---|---|
| 5,246,879 | * 9/1993 | Hsu et al. | 437/180 |
| 5,408,121 | * 4/1995 | Nakamura et al. | 257/433 |
| 5,642,261 | 6/1997 | Bond et al. . | |
| 5,677,575 | * 10/1997 | Maeta et al. | 257/778 |
| 5,710,459 | 1/1998 | Teng et al. . | |
| 5,732,102 | * 3/1998 | Bouadma | 372/96 |
| 6,046,495 | * 4/2000 | Urushima | 257/668 |
| 6,049,128 | * 4/2000 | Kitano et al. | 257/737 |

FOREIGN PATENT DOCUMENTS

| | | |
|---|---|---|
| 60-7152 | 1/1985 | (JP) . |
| 1-286448 | 11/1989 | (JP) . |
| 4-98875 | 3/1992 | (JP) . |
| 7-297196 | 11/1995 | (JP) . |
| 8-102473 | 4/1996 | (JP) . |
| 8-124965 | 5/1996 | (JP) . |
| 9-205113 | 8/1997 | (JP) . |
| 367570 | 8/1988 | (TW) . |
| 86114538 | 10/1997 | (TW) . |

OTHER PUBLICATIONS

Taiwaneese Office Action and Japanese Translation of Office Action dated Oct. 7, 2000 Ref: 310365.
(CNS) A4 (210×297) 8,7, 6 and 2 English Language Translation.

* cited by examiner

*Primary Examiner*—Roy Potter
(74) *Attorney, Agent, or Firm*—McDermott, Will & Emery

(57) ABSTRACT

There is described a plastic molding semiconductor package employing a ball grid array (BGA) and a compact chip-size package (CSP) in combination which can alleviate the stress exerted on electrode bumps, can reduce noise and cross-talk among signal electrodes, can increase a coefficient of thermal expansion, and can prevent passage of neutrons. A semiconductor chip is stacked on an insulating substrate by way of a stress alleviation film. The stress alleviation film is bonded to a marginal area of the semiconductor chip which has the maximum stress distribution density stemming from a difference in coefficient of thermal expansion between the semiconductor chip and the insulating substrate, and shielding electrodes are provided in the marginal area of the insulating substrate. As a result, the stress exerted on the semiconductor chip and the signal electrodes is alleviated. The stress alleviation film having a shielding layer is bonded to the marginal area of the semiconductor chip. Each of the signal electrodes provided on the insulating substrate may be coaxially surrounded by a cylindrical shielding array. A package having a heat sink maybe used for packaging the semiconductor device. Any one of the insulating substrate, a sealing material, and the package may be formed from deuterium-containing resin.

9 Claims, 11 Drawing Sheets polyimide resin containing deuterium

D : deuterium epoxy resin containing deuterium

D : deuterium

SEMICONDUCTOR DEVICE EMPLOYING GRID ARRAY ELECTRODES AND COMPACT CHIP-SIZE PACKAGE

BACKGROUND OF THE INVENTION

1. Field of the Invention

The present invention relates to a semiconductor device to be mounted on a motherboard, and more particularly, to a ball-grid-array resin packaged semiconductor device whose package size is substantially equal in size to a semiconductor chip (hereinafter sometimes referred to simply as a "chip").

2. Background Art

A ball grid array (hereinafter sometimes abbreviated to "BGA") of electrodes is suitable for constituting a compact chip-size package (hereinafter sometimes abbreviated to "CSP") in which solder bumps of electrodes are arranged in a matrix on the major surface of an insulating substrate having a semiconductor chip mounted on the opposite side thereof. A package employing a ball grid array (BGA) and a compact chip-size package (CSP) in combination will be hereinafter referred to simply as a "BGA/CSP structure." Recently, this BGA/CSP structure has often been used for high-density packaging of LSIs for use in a portable cellular phone or high-density packaging of DRAMs for use in a personal computer.

A motherboard is usually made of glass epoxy base material, and works to electrically connects a chip with another semiconductor elements or a semiconductor devices, or with other electronic components such as capacitors or resistors, to thereby constitute on-board circuitry. A chip has a coefficient of volume expansion of about 3 to $4 \times 10^{-6}/°$ C. In contrast, a motherboard has a coefficient of thermal expansion of about 20 to $60 \times 10^{-6}/°$ C.

As described above, since there is a significant difference in coefficient of thermal expansion between the chip and the motherboard, the BGA/CSP structure is required to assume the task of alleviating the stress exerted on connected portions of electrode bumps to be used as external electrodes for mounting purposes. This stress alleviation problem is described in, e.g., (1) Japanese Patent Application Laid-open No. 5-129366, (2) Japanese Patent Application Laid-open No. 7-321157, and (3) Japanese Patent Application Laid-open No. 8-102473.

In the disclosure of the Publication (1), a plurality of first bumps are arranged on the side of a polyimide TAB (Tape Automated Bonding) tape facing a chip, and a plurality of second bumps to be used as external electrodes for mounting purposes are arranged in a BGA on the side of the polyimide TAB tape facing the motherboard. The first and second bumps are connected together by means of a copper foil wiring layer laminated to double-sided tapes. Electrodes of the chip, mounted face-down on the first bumps, are electrically connected to electrode pads of the motherboard by way of the copper foil wiring layer and the second bumps of the TAB tape. In this example, the electrode pads of the motherboard are made compact so as to substantially fit into a projected area of the chip. The stress exerted on each of the bumps interposed between the chip and the motherboard is alleviated by means of the flexibility of the TAB tape, by reduction in the temperature required for soldering bumps, and by elimination of plastic-packaging of a chip. However, since the chip is not plastic-packaged or resin-packaged, the chip has the drawback of inferior mechanical strength or inferior weather resistance.

In the disclosure of the Publication (2), electrodes of a chip are directly connected to a wiring layer of an insulating film facing the chip. The electrodes and the wiring layer, which face each other, are bonded together by means of an adhesive tape and packaging. The chip electrodes are electrically connected to electrode pads of the motherboard by way of external electrodes for mounting purposes provided on the side of the insulating film facing the motherboard. The stress exerted on electrode bumps is alleviated by increasing the flexibility of the insulating film. Even when the chip is plastic-packaged, the resultant package size is substantially equal to the chip.

Publication (2) further describes another example in which the second bumps and the wiring layer are formed in a peripheral area which is greater in area than the chip and which is provided on the side of the insulating film facing the motherboard. In still another example described in Publication (2), the reverse surface of the chip is not sealed with resin, so as to permit direct attachment of a heat sink. However, such a package deviates from the CSP and becomes bulky.

In the disclosure of the Publication (3), a noise shielding layer and ground/power bumps are provided in an area greater than the chip size described in the Publication (2) so as to surround chip electrodes and signal electrode bumps of an insulating film. The noise shielding layer and the ground/power bumps are connected to ground/power electrodes of the chip electrodes, thereby reducing noise. However, even when the noise shielding layer is provided in the area greater than the chip size, as a natural consequence a shielding effect is weak.

As mentioned above, when a semiconductor device is made compact by arranging electrode bumps for mounting purposes into a BGA, there arise several other problems in addition to alleviation of the stress exerted on electrode bumps.

First, a wiring pattern connecting electrode bumps provided in the vicinity of an array grid pattern to corresponding chip electrodes inevitably becomes longer. If the number of electrode bumps increases as a result of an increase in the number of pins, pitches between electrode bumps become smaller, which in turn renders the wiring pattern thinner. In a case where an attempt is made to satisfy both an increase in the number of pins and packaging of a semiconductor device into a small area, the wiring pattern becomes longer and thinner. In any event, the wiring pattern becomes more prone to pick up noise.

In a chip for use with microwaves of frequency ranging from hundreds of mega-hertz to giga-hertz, as well as in a chip for use in a portable cellular phone or a personal computer, not only external noise but also cross-talk among signal electrode bumps must be reduced. The higher the packaging density, the bigger the problem of noise or cross-talk.

In outer space or an artificial environment in which passage of incoming α-rays or neutrons is not negligible, there is an increase in the necessity of reliably preventing soft-error failures, which would otherwise temporarily cause a faulty operation of the chip. Under these circumstances, the higher a packaging density, the more serious the prevention of soft-error failures.

Further, as the degree of integration of a semiconductor chip becomes higher, there is a growing necessity of efficiently dissipating to the outside the heat produced at the time of operation the chip.

The present invention has been conceived to solve the previously-mentioned problems, and a first object of the present invention is to provide a BGA/CSP semiconductor device for packaging purpose which alleviates the stress exerted on electrode bumps and is prevented from picking up noise.

A second object of the present invention is to provide a BGA/CSP type semiconductor device which alleviates the stress exerted on electrode bumps, is prevented from picking up noise, and prevents cross-talk between the semiconductor device and external signals.

A third object of the present invention is to provide a BGA/CSP type semiconductor device which alleviates the stress exerted on electrode bumps, is prevented from picking up noise, prevents cross-talk between the semiconductor device and external signals, and prevents cross-talk among electrode bumps.

A fourth object of the present invention is to provide a BGA/CSP type semiconductor device which alleviates the stress exerted on electrode bumps, is prevented from picking up noise, prevents cross-talk between the semiconductor device and external signals, prevents cross-talk among electrode bumps, and improves the ability to dissipate heat.

A fifth object of the present invention is to provide a BGA/CSP type semiconductor device which alleviates the stress exerted on electrode bumps, is prevented from picking up noise, prevents cross-talk between the semiconductor device and external signals, prevents cross-talk among electrode bumps, and prevents passage of incoming neutrons.

SUMMARY OF THE INVENTION

According to one aspect of the present invention, a semiconductor device comprises a semiconductor chip in which circuit elements are formed and chip electrodes are provided on the major surface thereof. An insulating substrate is provided of which major surface is to face a motherboard, and of which reverse surface receives the semiconductor chip. On the major surface of the insulating substrate, a plurality of signal electrodes are arranged in a grid array, and are electrically connected to the chip electrodes of the semiconductor chip. Also on the major surface of the insulating substrate, a plurality of shielding electrodes are arranged on a marginal area of the insulating substrate to surround the signal electrodes. A stress alleviation film is disposed between a marginal portion of the major surface of the semiconductor chip and a marginal portion of the reverse surface of the insulating substrate. Sealing material hermetically seals a clearance between the major surface of the semiconductor chip and the reverse surface of the insulating substrate. A package hermetically houses the sealed semiconductor chip, stress alleviation film, and insulating substrate. Wherein, the signal and shielding electrodes provided on the major surface of the insulating substrate may be connected to electrodes of a motherboard.

In the semiconductor device, the stress alleviation film may include therein a shielding layer which is connected to a shielding electrodes on the major surface of the insulating substrate.

In the semiconductor device, the insulating substrate may comprises, on the reverse side thereof, a carrier film which includes an internal circuit capable of switching electrical connection between the chip electrodes of the semiconductor chip and the signal electrodes or the shielding electrodes of the insulating substrate.

In the semiconductor device, the insulating substrate may comprises therein a shielding member which coaxially surrounds each of the signal electrodes and shielding electrodes provided on the major surface of the insulating substrate.

Other and further objects, features and advantages of the invention will appear more fully from the following description.

DETAILED DESCRIPTION OF THE PREFERRED EMBODIMENTS

Figure 1A:
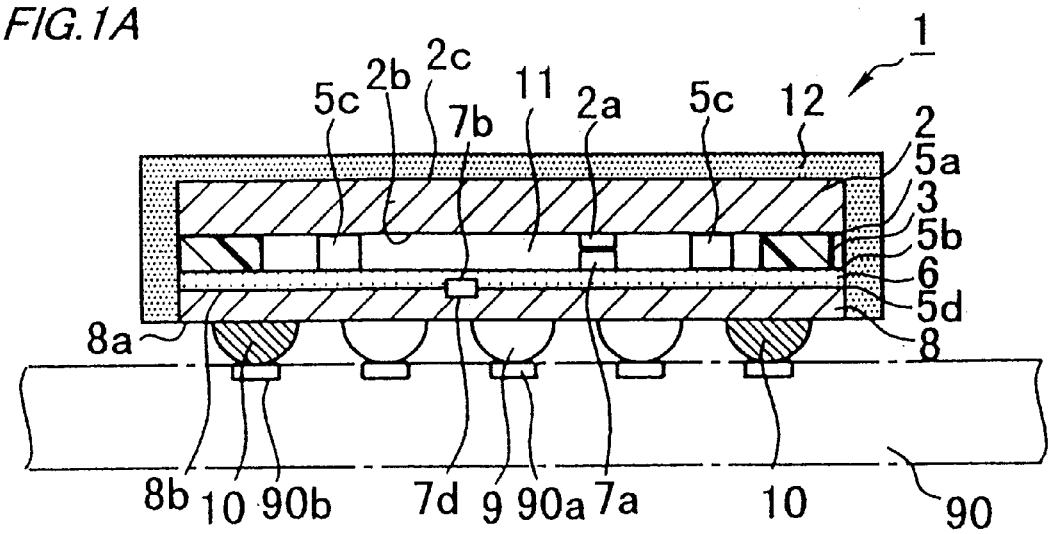
FIGS. 1 and 1B show a semiconductor device according to a first embodiment of the present invention in cross-sectional view and in bottom view respectively.

Some preferred embodiments of the present invention will be described hereinbelow by reference to the accompanying drawings. Throughout the embodiments, like reference numerals designate like or corresponding elements.

First Embodiment

Figure 1B:
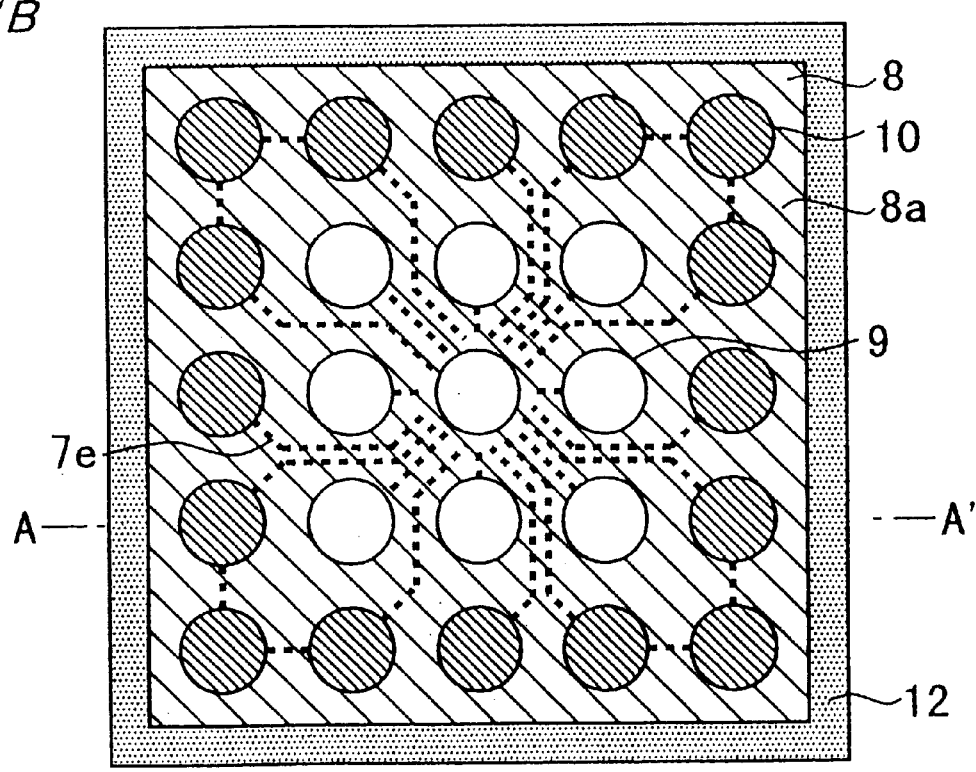

FIG. 1A and FIG. 1B show a semiconductor device for packaging purposes according to a first embodiment of the present invention. FIG. 1A is a cross-sectional view of the semiconductor device, and FIG. 1B is a bottom view of the same. FIG. 1A shows a cross-sectional view taken along a chain line A–A' shown in FIG. 1B.

Figure 2A:
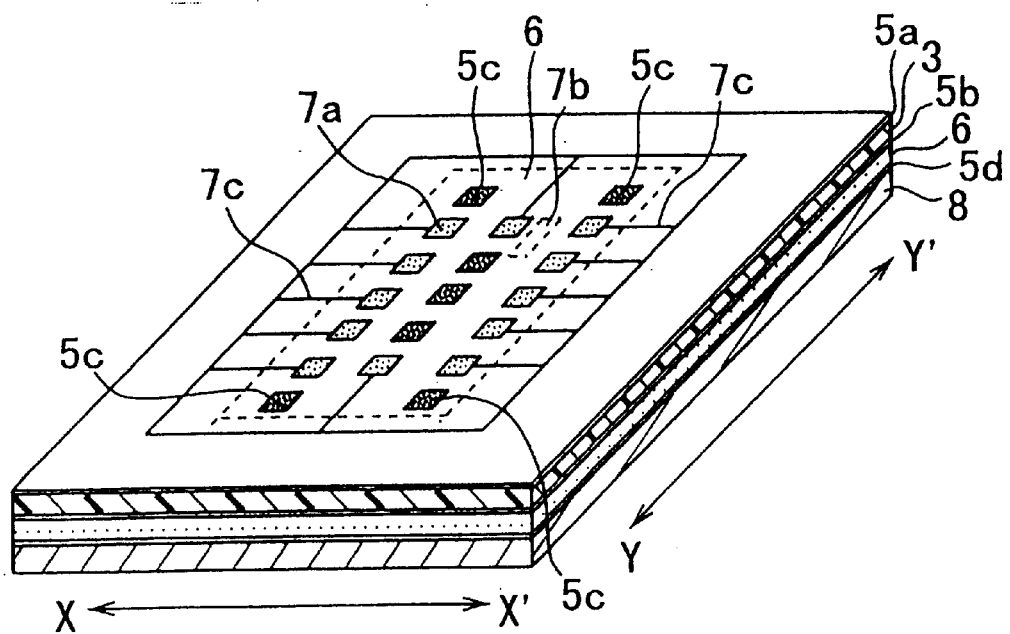
FIGS. 2A and 2B show the structure and manufacturing process for the semiconductor device according to the first embodiment in perspective views.
Figure 2B:
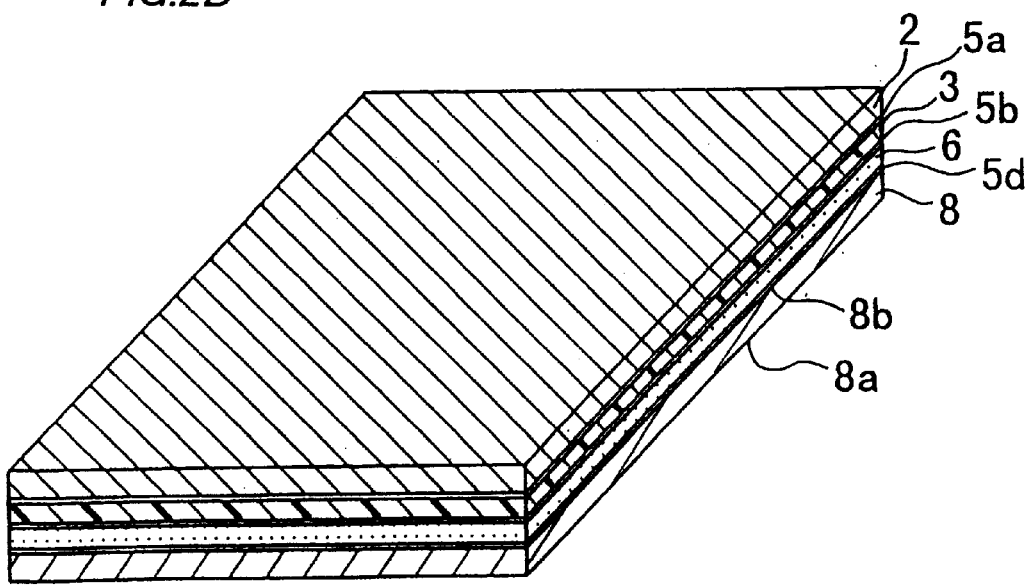
Figure 3A:
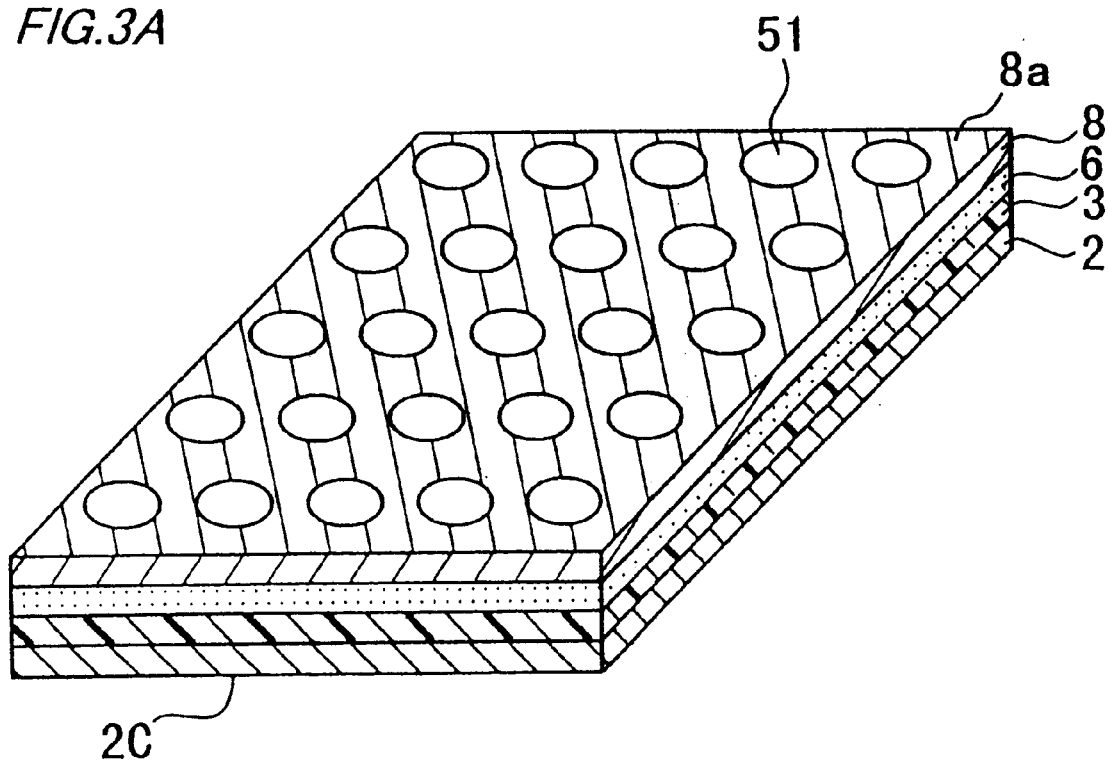
FIGS. 3A and 3B also show the structure and manufacturing process for the semiconductor device according to the first embodiment in perspective views.
Figure 3B:
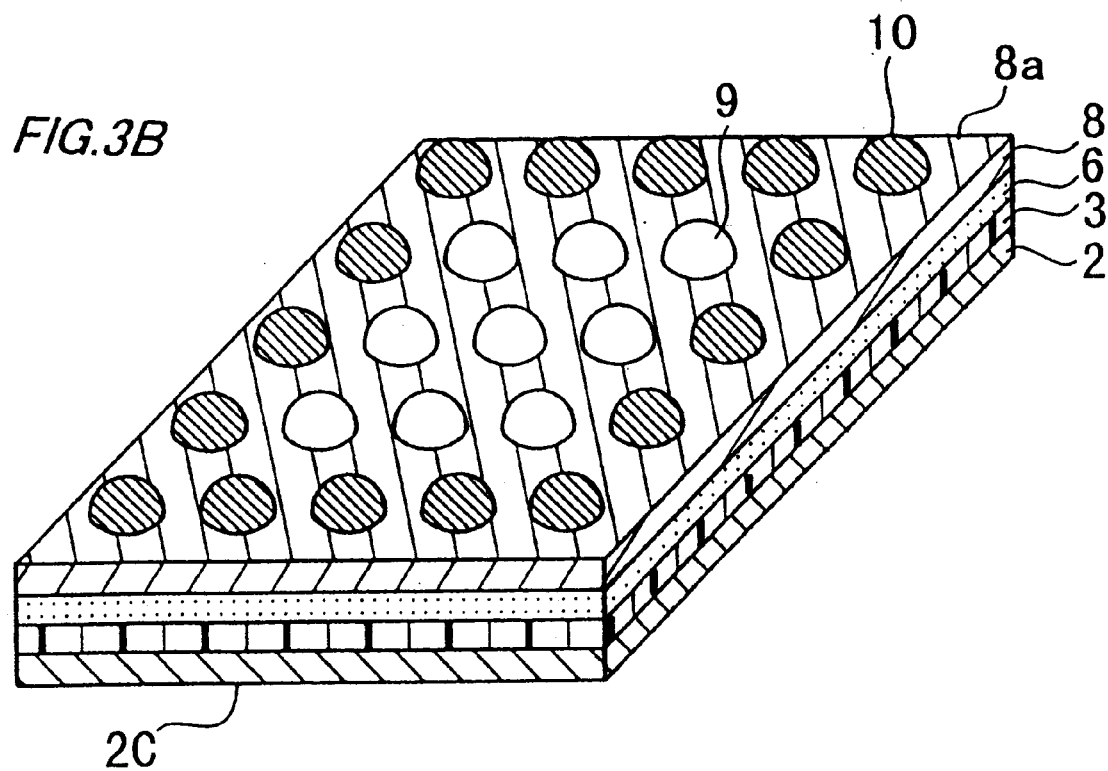

FIG. 2A and FIG. 2B are perspective views for describing the semiconductor device. FIG. 2A is a perspective view showing the semiconductor device while a semiconductor chip is removed from the device. FIG. 2B is a perspective view showing the semiconductor device while the semiconductor chip is placed in the device. FIG. 3A and FIG. 3B are perspective views showing the semiconductor device while it is placed upside down for explanation purposes. FIG. 3A is a perspective view showing the semiconductor device before formation of bumps on an insulating substrate, and FIG. 3B is a perspective view showing the semiconductor device after formation of the bumps.

Mounting of a semiconductor device 1 to a motherboard 90 will now be described by reference to FIG. 1A. In FIG.

1A, reference numeral 2 designates a chip made of a silicon substrate; 3 designates a stress alleviation film made of thermoplastic elastomer resin; 6 designates a carrier film made of polyimide-based resin; 8 designates an insulating substrate made of polyimide resin; 11 designates a sealing material; and 12 designates a package. The semiconductor device 1 is constituted of these elements.

Reference numerals 5a, 5b designate adhesives made of epoxy-based resin; 5c designates a partial adhesive member; and 5d designates a preliminary adhesive member for bonding the carrier film 6 to the insulating substrate 8 beforehand.

Reference numeral 2a designates a representative example of a plurality of chip electrodes of the chip 2; 7a designates on-film electrodes formed on the upper side of the carrier film 6; 7b designates under-film electrodes provided on the underside of the carrier film 6; 7d designates on-board electrodes provided on the upper surface of the insulating substrate 8; 9 designates signal solder bumps provided on the major surface of the insulating substrate 8; and 10 designates shielding solder bumps provided on the major surface of the insulating substrate 8.

Reference numeral 90a designates signal electrodes of the motherboard; and 90b designates shielding electrodes of the motherboard.

FIG. 1B is a bottom view of the semiconductor device 1. The plurality of solder bumps 9, 10 are provided on the major surface 8a of the insulating substrate 8 in a grid array pattern and work as external electrodes with respect to the motherboard 90. Reference numeral 7e designates a plurality of inner leads which are embedded in the insulating substrate 8 and are depicted by broken lines.

FIG. 2A is a perspective view showing the semiconductor device 1 while the semiconductor chip 2 is removed from the device. In FIG. 2A, the stress alleviation film 3 is formed into an annular outlined pattern, and the carrier film 6 is visible through a window of the stress alleviation film 3. Reference numeral 5c designates partial adhesive members which are formed on the upper surface of the carrier film 6 and are equal in thickness to the carrier film 6, i.e., have a thickness of about 1 mm (four rectangular dark areas in the drawing).

Reference numeral 7a designates on-film electrodes (rectangular gray areas) formed on the upper side of the carrier film 6; and 7b designates representative examples of a plurality of under-film electrodes which are formed on the underside of the carrier film 6 so as to differ in position from the on-film electrodes 7a (since the under-film electrodes are invisible, they are depicted by a broken line). Further, reference numeral 7c designates a plurality of in-film leads which are formed in the carrier film 6 and electrically connect the on-film electrodes 7a to the under-film electrodes 7b.

FIG. 2B shows the semiconductor chip 2 crimped onto the stress alleviation film 3 shown in FIG. 2A by way of the adhesive 5a.

As shown in FIG. 1A through FIG. 2B, the semiconductor chip 2 is adhesively crimped on the upper surface of the annular or rectangularly-outlined stress alleviation film 3 by way of the adhesive 5a applied to the film 3 while the major surface of the chip 2 (downside in the drawing) has the plurality of chip electrodes 2a provided thereon.

The stress alleviation film 3 has a thickness of about 1 mm and is substantially equal in size to the chip 2. The semiconductor chip 2 has a thermal expansion coefficient of about $3.1 \times 10^{-6}/°$ C., and the stress alleviation film 3 is formed from thermoplastic elastomer resin substantially equal in thermal expansion coefficient to the semiconductor chip 2, i.e., has a thermal expansion coefficient of about $2.7 \times 10^{-6}/°$ C. The stress alleviation film 3 has a rubber elasticity at room temperatures and has the property of being plasticized at high temperature. Accordingly, the stress alleviation film 3 can substantially constantly absorb thermal stress which is exerted on the semiconductor chip 2 during a packaging process, which will be described later, or in a heat cycle following the start-up of the semiconductor device.

Further, the stress alleviation film 3 is substantially equal in outer diameter to the semiconductor chip 2 and assumes a rectangularly-outlined shape. The bonding surface of the stress alleviation film 3 corresponds to the marginal area along the outer periphery of the semiconductor chip 2 having the maximum per-unit stress distribution density, thus enabling high stress burdening and uniform alleviation of the stress exerted on the semiconductor chip 2 in both the direction denoted by line X–X' and the direction denoted by line Y–Y' shown in FIG. 2A.

Both the carrier film 6 and the insulating substrate 8 are substantially equal in size to the semiconductor chip 2. The underside of the carrier film 6 is bonded to the upper surface of the insulating substrate 8 beforehand by means of the preliminary adhesive 5d.

The carrier film 6 is formed to a thickness of about 1 mm from a polyimide-based material analogous to the material of the insulating substrate 8.

As shown in FIG. 2A, the partial adhesive members 5c are arranged on the upper surface of the carrier film 6, and the semiconductor chip 2 is adhesively crimped on the adhesive members 5c. Further, the on-film electrodes 7a are directly connected to the plurality of chip electrodes 2a, respectively.

The under-film electrodes 7b are provided on the underside of the carrier film 6 so as to differ in position from the on-film electrodes 7a. Moreover, the plurality of in-film leads 7c are embedded in the carrier film 6 so as to electrically connect the on-film electrodes 7a to the under-film electrodes 7b.

The semiconductor chip 2 and the upper surface of the stress alleviation film 3 are adhesively bonded together by way of the adhesive 5a, and the lower surface of the stress alleviation film 3 and the upper side of the carrier film 6 are adhesively bonded together by way of the adhesive 5b. Further, the semiconductor chip 2 and the upper side of the carrier film 6 are adhesively bonded together by way of the adhesive members 5c. The plurality of chip electrodes 2a are directly connected to the on-film electrodes 7a. The mechanical crimping, bonding, and electrical connection among the semiconductor chip, the film, and the adhesives can be carried out collectively and simultaneously Next, electrical connections between the chip electrodes 2 and the insulating substrate 8 are collectively explained by reference to FIG. 1A through FIG. 2A. A plurality of electrode pads formed on the lower surface of the semiconductor chip 2 are directly connected, as the chip electrodes 2a, to the on-film electrodes 7a provided on the upper side of the carrier film 6. The chip electrodes 2a are further electrically connected to the under-film electrodes 7b provided on the underside of the carrier film 6, by way of the in-film leads 7c embedded in the carrier film 6.

The under-film electrodes 7b are electrically connected to the signal solder bumps 9 and the shielding solder bumps 10 provided on the major surface of the insulating substrate 5, by way of the plurality of on-board electrodes 7d provided on the upper surface of the insulating substrate 8 and the plurality of inner leads 7e embedded in the insulating substrate 8.

FIG. 3A is a top perspective view showing the semiconductor device 1 shown in FIG. 2B when the device is set upside down. By reference to FIG. 3, there will now be described a method of forming the signal solder bumps 9 and the shielding solder bumps 10, as well as electrical connections between the signal solder bumps 9 and the motherboard 90. The signal solder bumps 9 serve as external electrodes of the semiconductor device 1 with respect to the motherboard 90. A plurality of hemispherical recesses 51 to be used for forming the solder bumps 9 or 10 are formed in a grid array pattern in the semiconductor device 1 that has undergone bonding assembly and internal wiring operations. Solder balls are formed through use of solder wires formed from, e.g., Pb—Sn, by a wire bonding method. After the thus-formed solder balls have been soldered into the respective hemispherical recesses 51, the wires are cut, thus leaving solely the solder bumps 9 or 10.

The inner leads 7e of the insulating substrate 8 have already extended to the surface of the hemispherical recesses 51 and are connected respectively to the plurality of chip electrodes 2a by way of the foregoing electrical connections as a result of formation of the solder bumps 9 or 10. Depending on the manner in which the inner leads 7e of the insulating substrate 8 and the in-film leads 7c of the carrier film 6 are routed, the connection between the chip electrodes 2e and the signal solder bumps 9 can be switched so as to be able to respond to various requirements from the motherboard 90.

The signal solder bumps 9 depicted by hollow circles in FIG. 3B are arranged in the center area of the insulating substrate 8. In contrast, the crosshatched shielding solder bumps 10 are arranged in the peripheral area of the insulating substrate 8 so as to surround the entire group of signal solder bumps 9. More specifically, the shielding solder bumps 10 are arranged in the area of the insulating substrate 8 corresponding to the peripheral area of the semiconductor chip 2, i.e., the area of the insulating substrate 8 corresponding to the outer peripheral area of the semiconductor chip 2 which is bonded to the bonding surface of the rectangularly-outlined stress alleviation film 3 and which has the maximum per-unit stress distribution density. As a result, the stress exerted on the shielding solder bumps 10 is increased, whereas the stress exerted on the signal solder bumps 9 is decreased correspondingly.

Turning back to FIG. 1A, the semiconductor device 1, which has undergone electrical connection, is placed in a sealing mold, and the sealing material 11 formed from epoxy resin is filled into the mold, thus molding the semiconductor device 1. The sealing material 11 adhesively and hermetically fixes the lower surface of the semiconductor chip 2 to the upper surface of the stress alleviation film 3; more specifically, the sealing material seals the gap among the constituent elements of a stacked assembly in the window of the stress alleviation film 3 (see FIG. 2A), thereby shielding the semiconductor chip 2 from the external environment. As a result of the semiconductor device 1 fixed by the sealing material 11 being covered with the package 12 made of epoxy resin, there is completed the semiconductor device 1 whose package 12 is substantially equal in size to the semiconductor chip 2 and which comprises a stress alleviation means constituted of the stress alleviation film 3 interposed between the semiconductor chip 2 and the semiconductor bumps 9, 10.

The signal solder bumps 9 act as external electrodes of the semiconductor device 1 which permit flow of input and output signals between the semiconductor chip 2 and the motherboard 90. Mounting of the semiconductor device 1 to the motherboard 90 is completed by soldering the signal solder bumps 9 to the electrodes 90a of the motherboard 90 and by soldering the shielding solder bumps 10 to the ground-potential electrodes 90b of the motherboard 90.

Since the plurality of solder bumps 9, 10 are mechanically soldered to the plurality of electrodes 90a, 90b of the motherboard 90, the stress exerted on the insulating substrate 8 may be dispersed to the motherboard 90. Particularly, since the plurality of shielding solder bumps 10 are provided so as to correspond to the marginal area of the semiconductor chip 2 which has the maximum stress distribution density, the stress exerted on each signal solder bump 9 is significantly reduced. Accordingly, there is improved the reliability of electrical connection of the semiconductor device against the bending load imparted to the semiconductor device from the motherboard 90 or against heat cycles.

The signal solder bumps 9 surrounded by the ground-potential shielding solder bumps 10 are electrically shielded by means of the shielding solder bumps 10 from external signals other than the signals exchanged between the semiconductor chip 2 and the motherboard 90. Accordingly, there can be achieved the CSP semiconductor device 1 which lessens external noise and prevents cross-talk between external signals and the signal solder bumps 9.

Some of the modification of the first embodiment will now be described.

(A) Although the foregoing description has explained the case where the stress alleviation film 3 assumes a rectangularly-outlined shape, the foregoing case is merely one of the examples of the stress alleviation film. So long as the stress alleviation film assumes an annular shape which enables an increase in the area to be bonded to the marginal area of the semiconductor chip 2 having the maximum per-unit stress density distribution, the stress alleviation film may assume a polygonal shape, such as a quadrangle, octagon, or a polygon having more sides, or an oval shape.

(B) Further, so long as the area of the stress alleviation film 3 to be bonded to the marginal area of the semiconductor chip 2 is broader than a predetermined value and has a symmetrical shape, the stress alleviation film 3 may assume a non-annular shape. For example, the stress alleviation film may be formed into a cross-shaped or X-shaped pattern which is substantially equal in external width to the semiconductor chip 2 or into a shape symmetrical with respect to four corners or sides of the semiconductor chip 2. In this case, the chip electrodes 2a are arranged, for instance, so as to become spaced away from the cross-shaped path, so that the inflow conductance of the sealing material 11 into the gap between the non-annular stress alleviation film 3 and the semiconductor chip 2 is increased, thus enabling configuration of the semiconductor device 1 having superior sealing reliability.

(C) Although the method of forming solder bumps has been described by reference to the case where solder bumps are formed by means of the solder wire bonding method, the method is not limited to such a method. The solder bumps may be formed by the electrolytic plating method.

(D) Although all the solder bumps corresponding to the marginal area of the insulating substrate 8 are described as the shielding solder bumps 10, the present invention is not limited to this embodiment. The plurality of shielding solder bumps 10 may be arranged so as to surround the plurality of signal solder bumps 9. In other words, in a case where the chip electrodes 2a are segmented into, e.g., four blocks in the shape of a four-paned window, where the stress alleviation film 3 is formed into a cross-shaped pattern, and where the solder bumps are formed in four segmented blocks, the signal solder bumps 9 may be surrounded by the shielding solder bumps 10 within each block.

(E) According to the requirements of a circuit to which the present invention is applied, shielding solder bumps to be connected to a power potential may be provided in lieu of the shielding solder bumps 10 connected to a ground potential.

As described above, in the semiconductor chip 1 according to the first embodiment of the present invention, the carrier film 6 is bonded beforehand to the reverse side 8b (corresponding to the upper side shown in FIG. 1A) of the insulating substrate 8 which is substantially equal in size to the semiconductor chip 2. By way of the adhesive members 5c provided on the upper side of the carrier film 6 as well as the adhesive members 5a, 5b provided on the respective sides of the stress alleviation film 3 bonded at least between the semiconductor chip 2 and the marginal area of the insulating substrate 8; the semiconductor chip 2, the stress alleviation film 3, and the insulating substrate 8 are crimped on one another. Simultaneously, the chip electrodes 2a and the on-film electrodes 7a are directly connected to one another, thus stacking layers.

The plurality of signal solder bumps 9 are arranged in a grid array pattern on the major surface 8a of the insulating substrate 8, and permit flow of input and output signals between the semiconductor chip 2 and the motherboard 90. Further, the plurality of shielding solder bumps 10 are arranged at least in the marginal area of the major surface 8a of the insulating substrate 8, and surround the signal solder bumps 9 and are connected to a ground or power potential so as to shield the signal solder bumps 9. Subsequently, the semiconductor chip 2 is then hermetically sealed and housed into the package 12 which is substantially equal in size to the semiconductor chip 2.

Second Embodiment

Figure 4A:
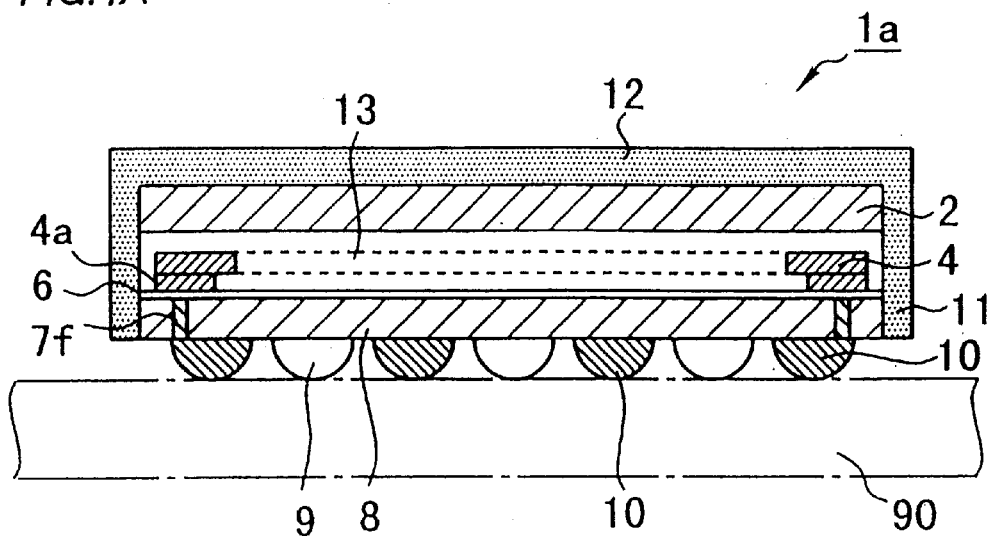
FIGS. 4A and 4B show a semiconductor device according to a second embodiment of the present invention in cross-sectional view and in bottom view respectively.
Figure 4B:
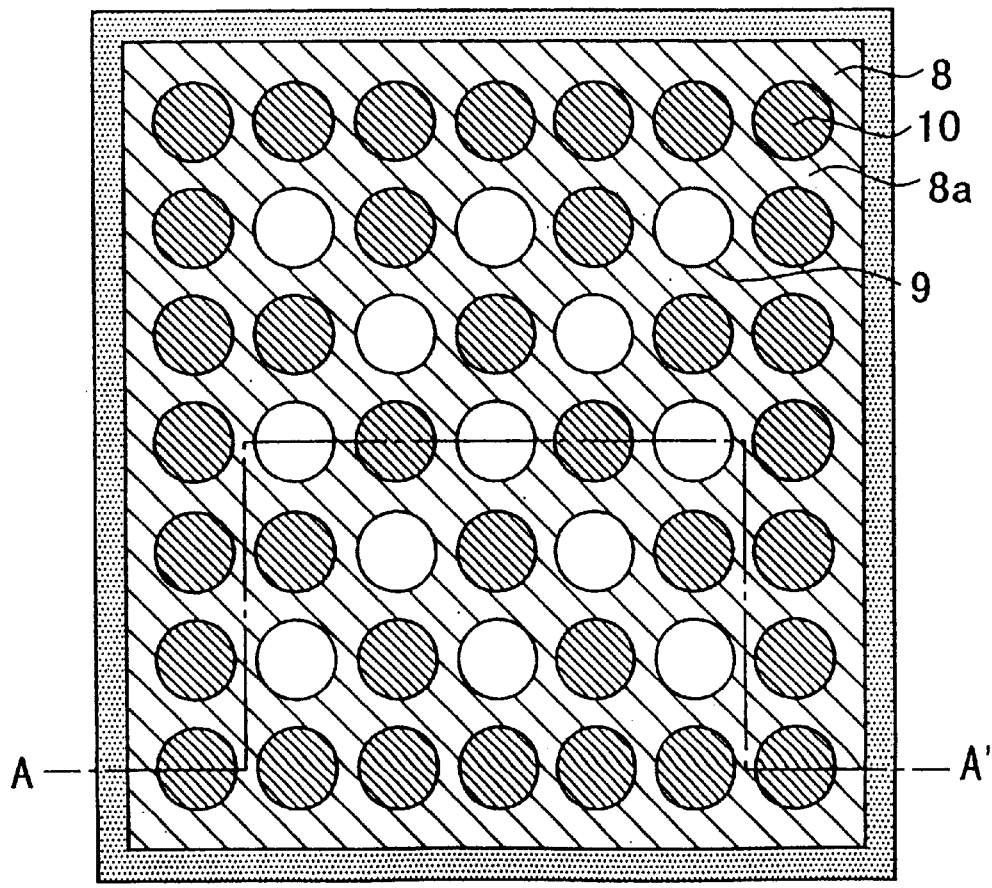
Figure 5A:
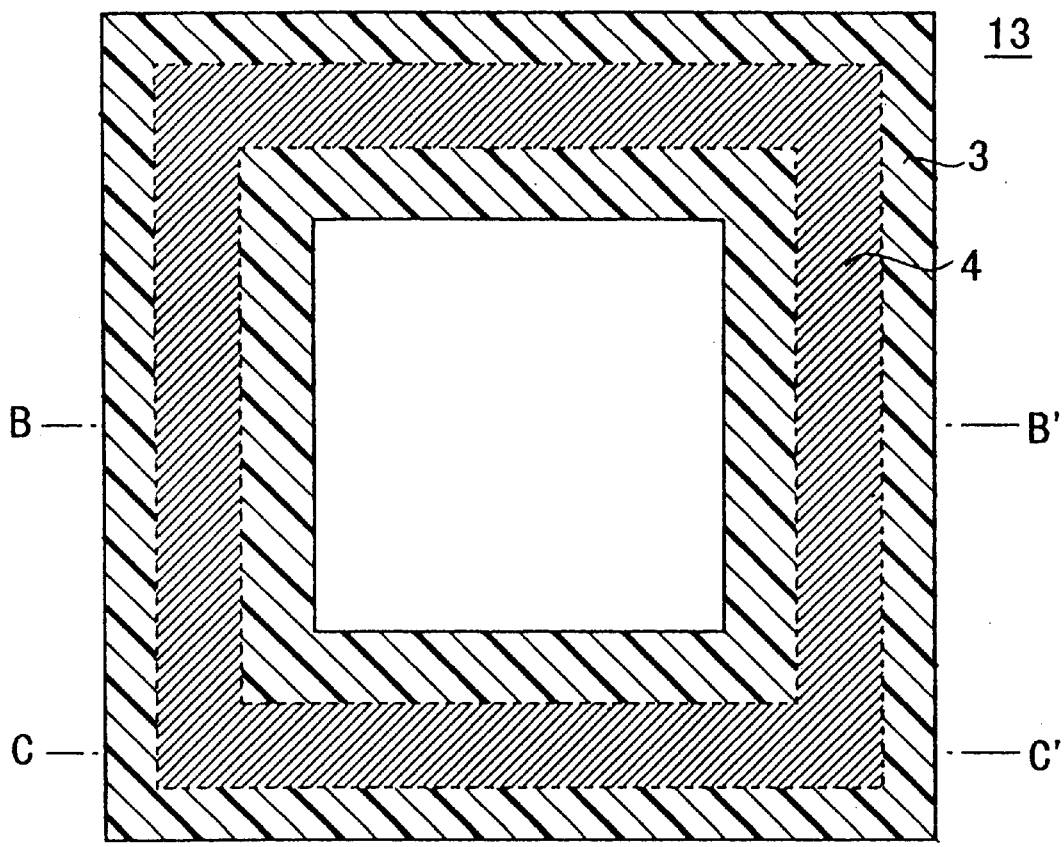
FIGS. 5A through 5C show a stress alleviation film including a shielding layer of the semiconductor device according to the second embodiment in bottom view and in cross-sectional views respectively.
Figure 5B:
Figure 5C:
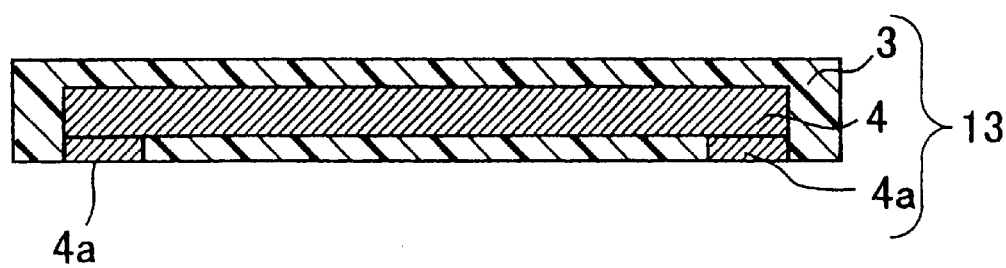

FIG. 4A is a cross-sectional view showing a semiconductor device for packing purposes according to a second embodiment of the present invention, and FIG. 4B is a bottom view showing the semiconductor device. FIG. 5A is a plan view showing a stress alleviation film including a shielding layer; and FIGS. 5B and 5C are cross-sectional views showing the stress alleviation film. Explanations for the reference numerals which are identical with or correspond to those used for the first embodiment shown in FIG. 1A through FIG. 3B are omitted here, and explanations are given solely in connection with the elements relevant to the second embodiment.

The stacked structure of a semiconductor device 1a will now be described hereinbelow by reference to FIG. 4A. The first difference between the first embodiment shown in FIG. 1A through FIG. 3B and the second embodiment shown in FIG. 4A through FIG. 6B lies in that a stress alleviation film 13 is bonded between the semiconductor chip 2 and the carrier film 6. The stress alleviation film 13 is made of a composite film having embedded therein the shielding layer 4 and shielding layer electrodes 4a.

The structure of the composite stress alleviation film 13 including the shielding layer 4 will be described hereinbelow. FIG. 5B is a cross-sectional view taken along chain line B–B' in the plan view of FIG. 5A, and FIG. 5C is a cross-sectional view taken along chain line C–C' in FIG. 5A. The shielding layer 4 is a conductive film formed from, e.g., aluminum, copper, or gold, to a thickness of 0.1 to 0.5 mm. The shielding layer 4 is embedded into the stress alleviation film 3 made of thermoplastic elastomer resin so as not to become exposed outside of the stress alleviation film. In the example shown in FIG. 5c, the four shielding layer electrodes 4a are formed from the same conductive film as that of the shielding layer 4. These shielding electrodes 4a are provided at four corners of the stress alleviation film 3 and are electrically connected to the shielding layer 4. Further, the shielding electrodes 4a are electrically connected to the shielding solder bumps 10 connected to the ground potential by way of the on-film electrodes 7a, which will be described later.

When the composite stress alleviation film 13 including the shielding layer 4 is used for the process shown in FIG. 2A, the shielding layer 4 is arranged so as to wholly and closely surround the chip electrodes 2a, the in-film leads 7c embedded in the carrier film 6, and the leads 7e embedded in the insulating substrate 8 (not illustrated in FIGS. 4A and 4B, see FIGS. 1A and 1B). Although the stress alleviation film 13 is equal in area to the stress alleviation film 3, the film 13 has superior noise reduction capability.

As shown in FIG. 4B, the second characteristic of the semiconductor device 1a is that the signal solder bumps 9 and the shielding solder bumps 10 are alternately arranged on the major surface 8a of the insulating substrate 8 in such a way that each signal solder bump 9 is surrounded by four shielding solder bumps 10. Further, as shown in FIGS. 4A and 4B, the four shielding solder bumps 10 provided at the four corners of the insulating substrate 8 are connected to the four shielding layer electrodes 4a provided at the fourth corner by way of through-hole inner leads 7f of the insulating substrate 8.

In the semiconductor device 1 according to the first embodiment, there can be prevented cross-talk between external signals and the signal solder bumps 9. In addition, in the semiconductor device 1a according to the second embodiment, cross-talk among the signal solder bumps 9 can be prevented by connecting the four shielding solder bumps 10 surrounding the signal solder bump 9 to the shielding solder bumps 10 which are equal in potential to the shielding layer 4, by means of the ground-potential chip electrodes 2a or the ground-potential inner leads 7e.

Even when the shielding solder bumps 10 which are equal in potential to the shielding layer 4 are connected to the ground potential by way of the electrodes 90a of the motherboard 90, the signal solder bumps 9 are electrically shielded, thereby preventing cross-talk among the signal solder bumps 9.

Some modifications of the second embodiment will now be described.

(F) Although the foregoing description has explained the shielding layer 4 which is a rectangularly-outline plate, the present embodiment shows a mere example of the shielding layer. For instance, the shielding layer 4 may be formed into a plate in which a plurality of holes are formed in a grid array pattern. In this case, cross-talk among the signal solder bumps 9 can be more effectively prevented.

(G) Although the shielding layer electrodes 4a are provided at the four corners of the stress alleviation film 13, the present invention is not limited to such an example. For instance, the shielding layer electrode may be formed into a shallow cylindrical shape so as to come into contact with the entire circumference of the shielding layer 4. In short, the shielding layer 4 and the shielding layer electrode 4a maybe formed into a continual layer in the form of a hollow rectangular sheet.

(H) Although the foregoing description explains the case where the shielding layer 4 and the shielding layer electrodes 4a are formed from a metal film, they may be formed from a conductive resin film. In this case, the conductive resin film is similar in thermal expansion coefficient to the stress alleviation film 3 formed from thermoplastic elastomer resin, and hence the original function of the stress alleviation film 3 is not impaired.

(I) Although each signal solder bump 9 is surrounded by the four shielding solder bumps 10, the present invention is not limited to this example. For instance, two adjacent solder bumps 9, which receive an input complementary signal or produce a complementary output signal, can be surrounded by six shielding solder bumps 10. In this case, although the insulating substrate 8 is identical in area to the insulating substrate shown in FIG. 4B, there can be provided the signal solder bumps 9 in a number greater than that of the signal solder bumps shown in FIG. 4B.

(J) Although the foregoing description has explained the case where the shielding solder bumps 10 are connected to a ground potential, the present invention is not limited solely to this example. At least one of the shielding solder bumps 10 may be connected to the power potential.

As described above, the semiconductor device 1a according to the second embodiment comprises the composite stress alleviation film 13 which has the shielding layer 4 and the shielding layer electrodes 4a embedded therein and which is bonded between the semiconductor chip 2 and the carrier film 6. The shielding layer 4 wholly and closely surrounds the chip electrode 2a, the in-film leads 7e, and the inner leads 7e embedded in the insulating substrate 8. Accordingly, although the stress alleviation film 13 is equal in area to the stress alleviation film 3, the stress alleviation film 13 has superior noise reduction capability.

The plurality of shielding solder bumps 10, which surround the signal solder bumps 9 and are equal in potential to the shielding layer 4, are connected to the ground-potential chip electrodes 2a, the ground-potential inner leads 7e, or the electrodes 90a of the motherboard 90, thereby shielding the signal solder bumps 9 by means of the ground-potential shielding solder bumps 10. Accordingly, in addition to prevention of cross-talk between external signals and the signal soldering bumps 9, cross-talk among signal soldering bumps 9 can also be prevented.

Third Embodiment

Figure 6A:
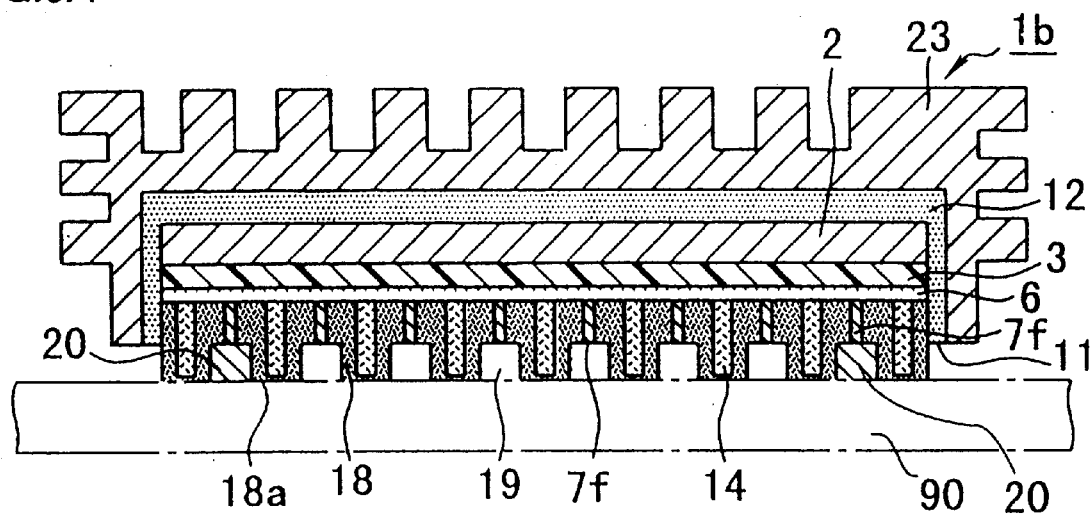
FIGS. 6A and 6B show a semiconductor device according to a third embodiment of the present invention in cross-sectional view and in bottom view respectively.
Figure 6B:
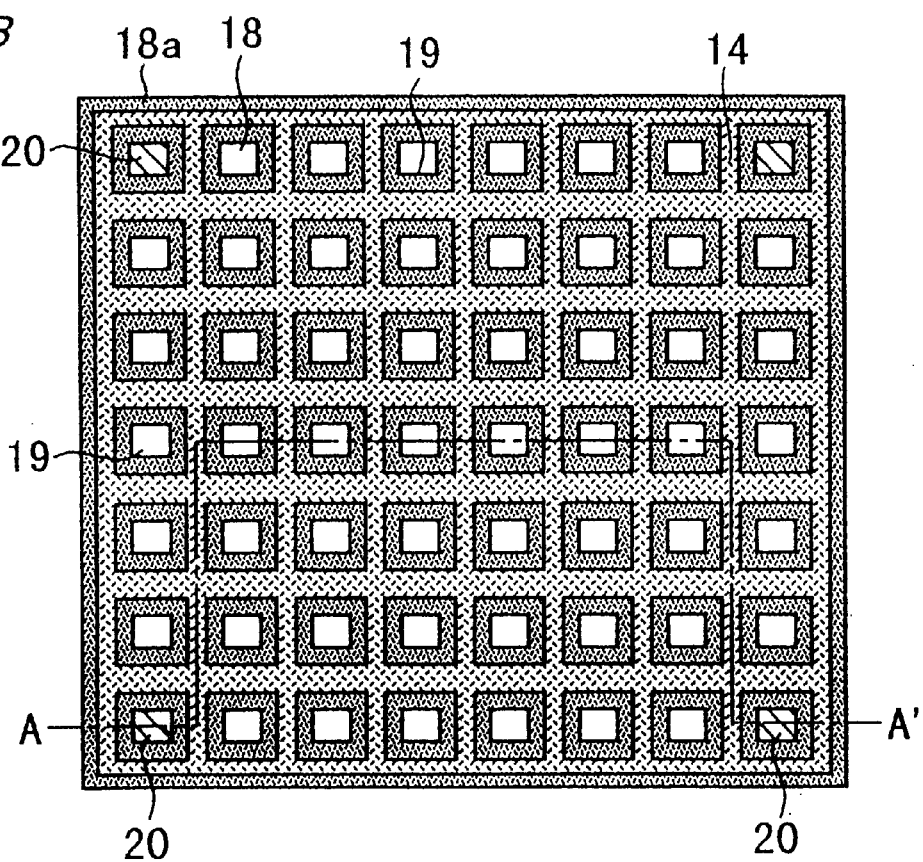
Figure 7A:
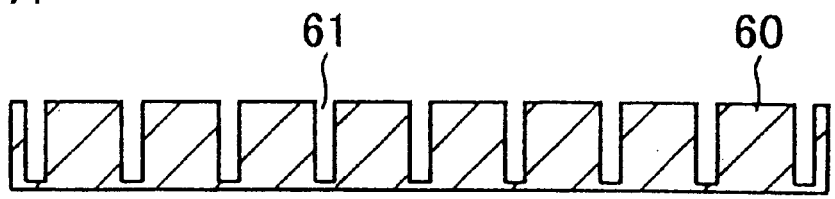
FIGS. 7A through 7D show the process of manufacturing an insulating substrate including a cylindrical shielding layer array according to the third embodiment in cross-sectional views.
Figure 7B:
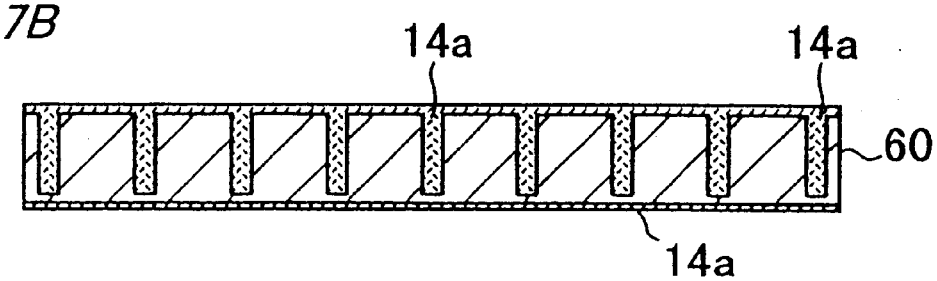

FIG. 6A and FIG. 6B show a semiconductor device for packaging purposes in cross-sectional view and in bottom view respectively. FIG. 7A thorough FIG. 7D show the process of manufacturing an insulating substrate including a cylindrical shielding layer in cross-sectional views, and FIG. 8A through FIG. 8D shows the processes of manufacturing an insulating substrate including rectangular solder electrodes in cross-sectional views. Explanations for the reference numerals which are identical with or correspond to those used in FIG. 1A through FIG. 5C are omitted here, and only the elements relevant to the third embodiment are described.

As shown in FIG. 6A and FIG. 6B, the first difference between a semiconductor device 1b according to the second embodiment and the semiconductor devices according to the first and second embodiments lies in that a shielding layer array 14 is included in an insulating substrate 18. FIG. 7A through FIG. 7D and FIG. 8A through FIG. 8D show the processes of forming the insulating substrate 18 including the shielding layer array 14.

The second difference lies in that angular signal electrodes 19 to be used as external electrodes of the semiconductor device 1b are arranged in a grid array pattern on the major surface 18a of the insulating substrate 18 so as not to protrude from the major surface 18a. FIG. 8A through FIG. 8D show the processes of forming the angular signal electrodes 19 and angular shielding electrodes 20.

The third difference lies in that a cylindrical shielding layer is formed in the insulating substrate 18 so as to coaxially surround the entire circumference of each angular signal electrode 19. The cylindrical shielding layer array 14 is embedded in the insulating substrate 18 in a matrix pattern. FIG. 7A through FIG. 7D show the processes of forming the cylindrical shielding layer array 14.

The fourth difference lies in that one end of the cylindrical shielding layer array 14 is electrically connected to the in-film leads 7c of the carrier film 6 (not illustrate in FIG. 6A through FIG. 8D, see FIG. 2A); that the shielding electrodes 20 connected to the ground potential are electrically connected to the in-film leads 7c by way of the inner leads 7f of substrate through-holes 63 of the insulating substrate 18; and that the film inner leads 7c are connected to the chip electrodes 2a by way of the on-film electrodes 7a (see FIG. 1A). In FIG. 6A and FIG. 6B, the four electrodes at the corner corresponds to the shielding electrode 20, and the other electrodes correspond to the signal electrodes 19.

The fifth difference lies in that a package 23 having a heat sink is used.

The processes of forming the insulating substrate 18 including the cylindrical shielding layer array 14 will now be described by reference to FIG. 7A through FIG. 7D. FIG. 7A is a cross-sectional view showing a molded member 60 of the insulating substrate 18 which is molded by pouring polyimide resin into a mold. In the drawing, a cylindrical hole 61 is formed into a rectangular slit having a width of about 1 mm. The width of the rectangular slit constitutes the thickness of the cylindrical shielding layer array 14. The conductive material 14a of the cylindrical shielding layer array 14 may be the same as that of the shielding layer 4 included in the foregoing stress alleviation film 13 which is explained in the second embodiment. For instance, as shown in FIG. 7B, gold is deposited on both sides of the insulating substrate 18. Subsequently, the gold adhering to both sides of the molded member 60 is removed through chemical and mechanical polishing while the polyimide resin is used as a stopper, thus forming the cylindrical shielding layer array 14 embedded in the molded body 60, as shown in FIG. 7C.

The processes of manufacturing the insulating substrate 18 including the rectangular signal electrodes 19 and the rectangular shielding electrodes 20 will now be described by reference to FIGS. 7C, 7D, and FIG. 8a through FIG. 8D.

Figure 7C:
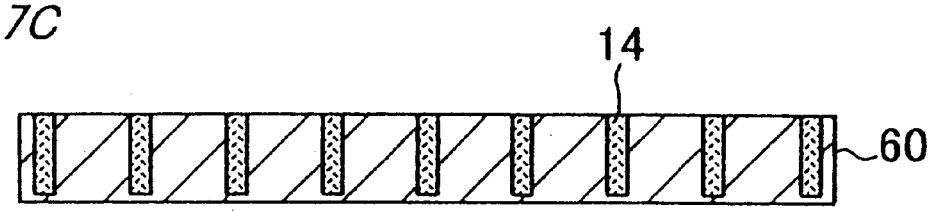
Figure 7D:
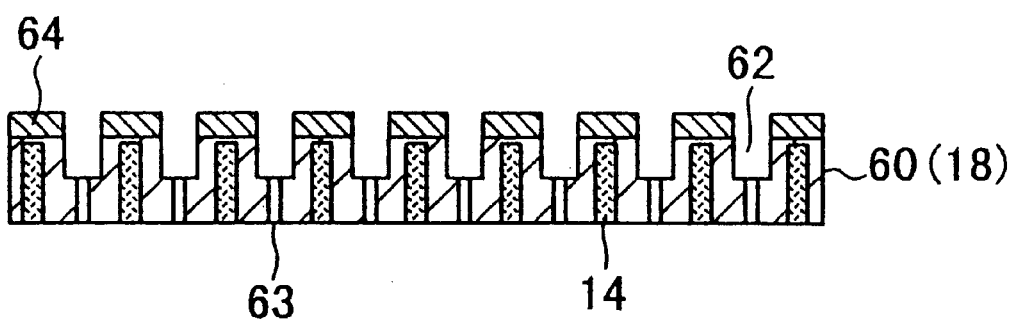

As shown in FIG. 7D, after formation of the cylindrical shielding layer array 14, the insulating substrate is turned upside down from the state shown in FIG. 7C. In this state, the molded body 60 is etched through use of a patterned mask 64, thereby forming the angular windows 62 and the through holes 63 so as to pass through the substrate bottom portion. The angular windows 62 and the substrate through-holes 63 are used for forming angular electrodes.

Figure 8A:
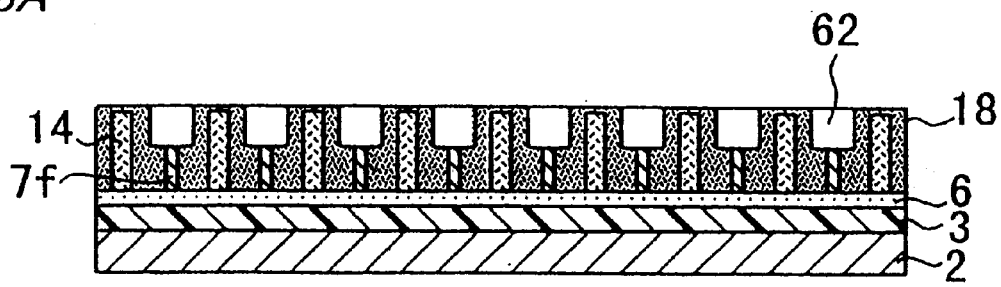
FIGS. 8A through 8D show the process of forming rectangular solder electrodes according to the third embodiment in cross-sectional views.

Then, as shown in FIG. 8A, the insulating substrate 18 shown in FIG. 7D, the carrier film 6, the stress alleviation film 3, and the semiconductor chip 2 are assembled according to a method differing from that according to the aforementioned first embodiment (shown in FIG. 3B).

Figure 8B:
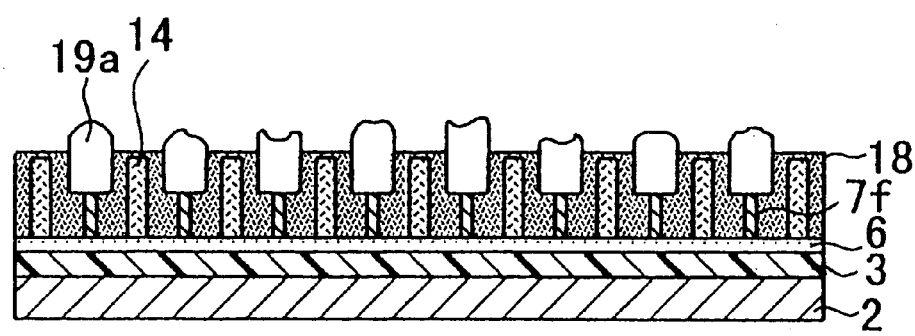

Soldering material for use with an angular electrode, e.g., solder comprising Pb—Sn, is filled into the angular windows 62 by an electrolytic plating method, as shown in FIG. 8B, until the soldering material protrudes from the insulating substrate 18. At this time, since the cylindrical shielding layer array 14 is not exposed on the surface of the insulating substrate 18, there is no chance of a short circuit arising between the signal angular electrodes 19a and the cylindrical shielding layer array 14.

Figure 8C:
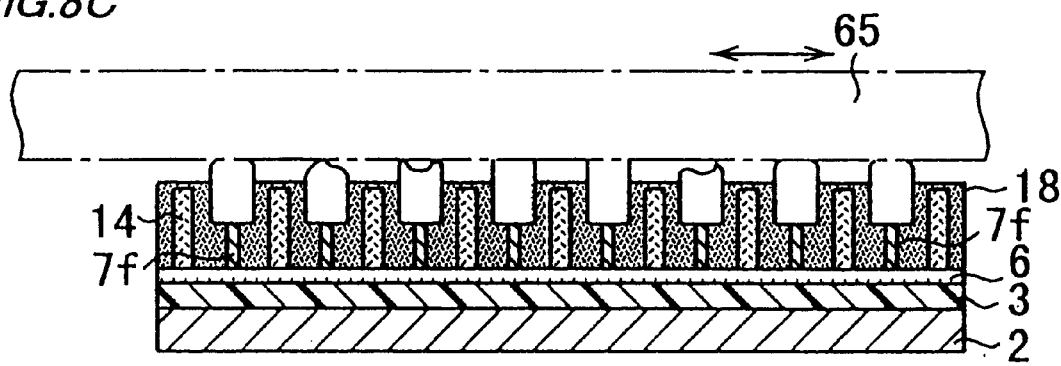
Figure 8D:
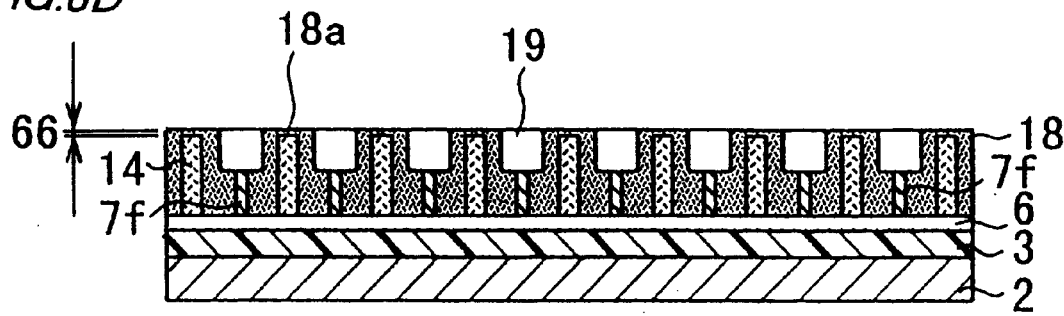

In the step shown in FIG. 8C, the angular signal electrodes 19a and the insulating substrate 18 are uniformly abraded through use of an abrasive disk 65. While care is taken not to excessively abrade the insulating substrate 18 during the abrading process until the cylindrical shielding layer 14 becomes exposed, the thickness of the surface of the insulating substrate 18, i.e., a residual surface thickness 66, is controlled so as to assume a value of more than 1 µm as shown in FIG. 8D. Further, the abrasion of the insulating substrate 18 is completed in the state where the solder metal of the angular electrodes 19a do not protrude from the major surface 18a of the insulating substrate 18. More specifically, electrodes 19 are finished into non-protruding pads instead of protruding bumps.

After angular signal solder electrodes 19 and the insulating substrate 18 have been uniformly abraded, the sealing material 11 made of epoxy resin is filled into the assembly, as shown in FIG. 6A, and the assembly is molded by means of a heating mold. Finally, the assembly is packaged into the package 23 having a heat sink, whereby the semiconductor device 1b shown in FIG. 6 is completed.

The shielding layer array 14 coaxially shields each of the angular signal electrodes 19. Cross-talk among the angular signal electrodes 19 can be prevented by connecting the shielding layer array 14 to the ground-potential shielding electrodes 20 and to the ground potential by way of the chip electrodes 2a or the electrodes 90a of the motherboard 90, as in the case of the foregoing semiconductor device 1a in the second embodiment.

Some of the modifications of the third embodiment will now be described.

(K) In a case where the stress alleviation film 13 including a shielding layer is used in place of the stress alleviation film 3 used in the example shown in FIG. 3B, cross-talk among the signal electrodes 19 can be reduced to a much greater extent.

(L) Although the cylindrical shielding layer array 14 is formed into a rectangular slit, the array may be formed into, e.g., a hexagonal or octagonal slit or into a cylindrical slit. In this case, the array does not have any cute angular portions which would otherwise cast a shadow, also serving to improve the uniformity of a film formed by the electrolytic plating method.

(M) Although the foregoing description has explained the case where the angular signal electrodes 19 to be used as external electrodes are formed so as not to protrude from the major surface 18a of the insulating substrate 18, the previously-mentioned signal solder bumps 9 may also be used in a case where the signal electrodes are adapted so as to satisfy the requirements for combination with the electrodes 90a of the motherboard 90.

(N) In place of the angular signal electrodes 19, columnar signal electrodes may be formed by filling spherical solder bump into columnar windows whose bottoms are hemispherical instead of into the angular windows 62, under the wire bonding method and through use of the solder wire shown in FIG. 3B, and by abrading the bumps.

(O) Since the package 23 having a heat sink 23 (shown in FIG. 6A) is larger than the semiconductor chip 2, fins provided on both sides of the package as shown in FIG. 6A may be eliminated in a case where miniaturization of the package is a priority.

As explained above, the semiconductor device 1b according to the third embodiment of the present invention comprises the angular external electrodes 19, 20 having a superior area utilization factor and the package 23 which has a heat sink and efficiently dissipates the heat produced by the semiconductor chip 2. The semiconductor device 1b is more suitable for high integration and miniaturization than are the foregoing semiconductor devices 1a, 1b. Further, the semiconductor device has the insulating substrate 18 including the shielding layer array 14, and each of the angular signal electrodes 19 is coaxially shielded by the cylindrical shielding layer 14. Further, the signal electrodes 19 are formed into electrode pads which do not protrude from the major surface 18a of the insulating substrate 18. Accordingly, even in a case where the semiconductor device is used in a microwave range of 30 GHz, cross-talk among the signal electrodes 19 can be reliably prevented while the semiconductor device is held to a chip size.

Fourth Embodiment

Figure 9:
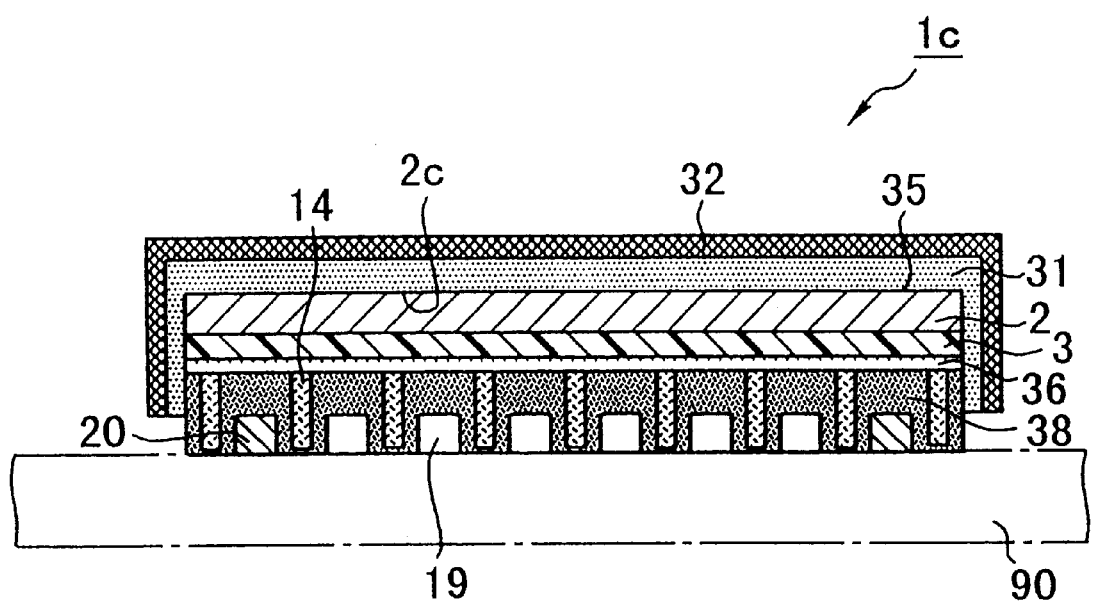
FIG. 9 is a cross-sectional view showing a semiconductor device according to a fourth embodiment of the present invention.
Figure 10A:
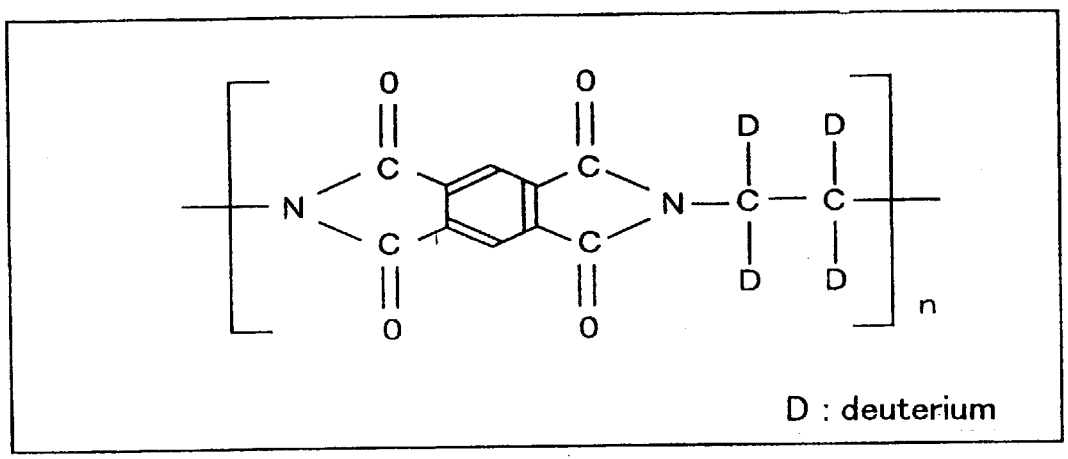
FIGS. 10A and 10B depict chemical formulae of deuterium-containing resin materials used for the semiconductor device according to the fourth embodiment.
Figure 10B:
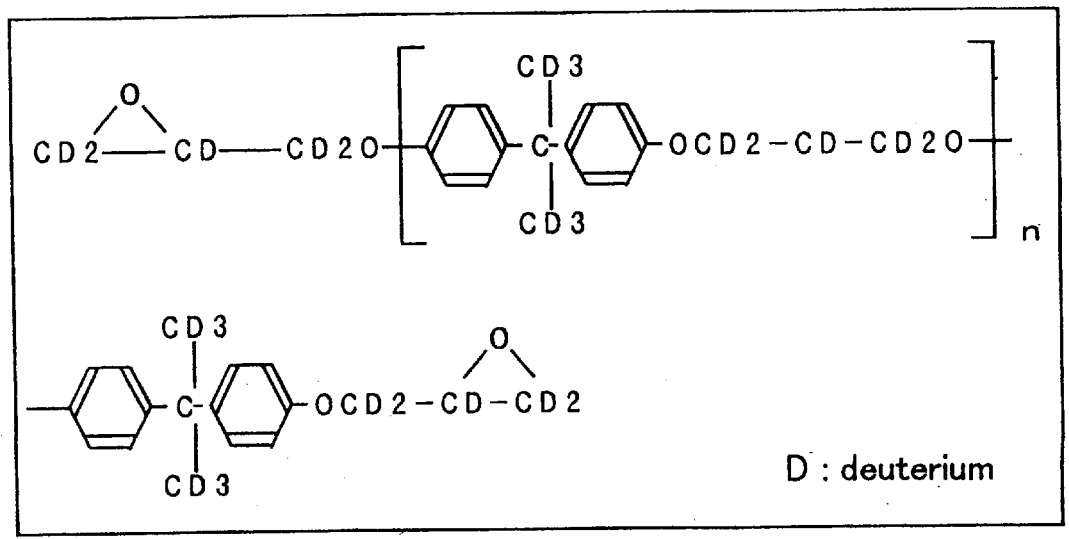
Figure 11A:
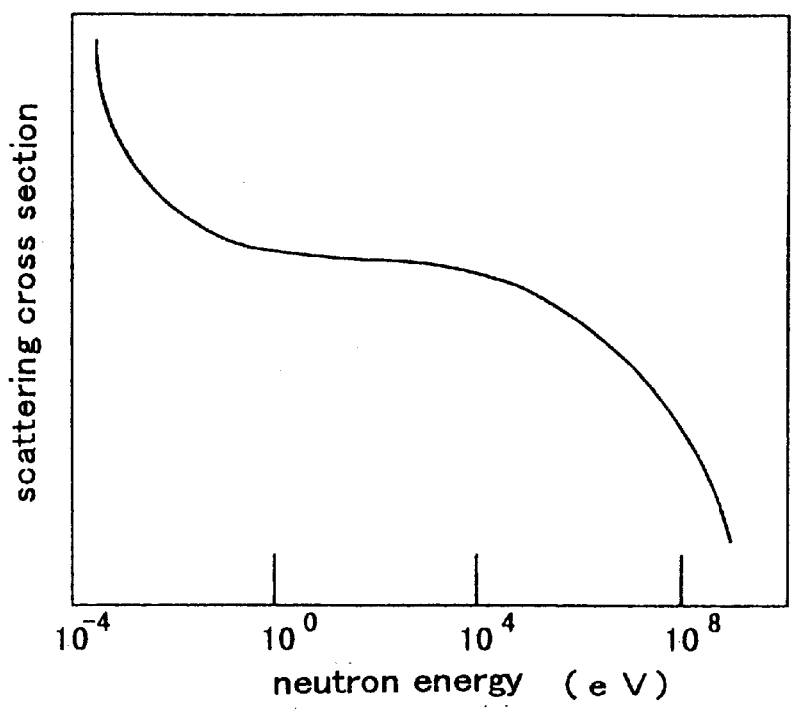
FIGS. 11A and 11B are graphs for describing scattering of neutrons caused by the deuterium-containing resin materials in the semiconductor device according to the fourth embodiment.
Figure 11B:
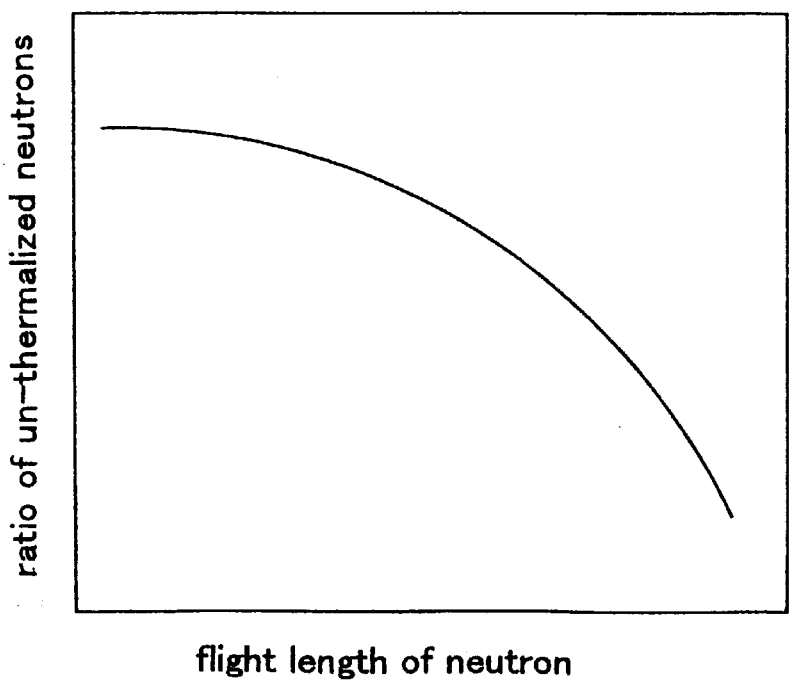

FIG. 9 is a cross-sectional view showing a semiconductor device 1c for packaging purpose according to a fourth embodiment of the present invention. FIG. 10A and FIG. 10B illustrate deuterium-containing resin material in explanatory views. FIGS. 11A and 11B are graphs showing the scattering of neutrons by means of the deuterium-containing resin material. Explanations for the reference numerals which are identical with or correspond to those provided in FIG. 1A through FIG. 8D are omitted here, and an explanation will be given solely of elements pertinent to the fourth embodiments.

Boron B11, which has a mass number of 11 and is commonly used for manufacturing a semiconductor device, generally includes an isotope B10 having a mass number of 10. If neutrons fly into a boron-silicate glass (BPSG), the neutrons react with B10 to produce α-rays. It is acknowledged that the thus-produced α-rays enter the silicon substrate of the semiconductor chip 2 to thereby produce a large quantity of electric charges and to cause soft-error failures.

Even in a case where no BPSG is used for a semiconductor device, if cosmic rays containing α-rays, for example, pass through the semiconductor chip 2, electron-hole pairs arise in the silicon substrate, and the electric charges greatly change the electric field or electric potential of the silicon substrate, thus temporarily causing faulty operations of the semiconductor chip 2.

The semiconductor device 1c according to the fourth embodiment is aimed at providing a semiconductor device which can prevent passage of neutrons even when used in outer space or an ambient environment in which incoming neutrons are not negligible.

As shown in FIG. 9 which is a cross-sectional view of the semiconductor device 1c, the first difference between the fourth embodiment and the first through third embodiments mentioned previously is that one of or both the insulating substrate 38 and the carrier film 36 is formed from deuterium-containing polyimide resin. The second difference lies in that one of or both the sealing material 31 and the resin package 32 is formed from deuterium-containing polyimide resin. The third difference lies in that a deuterium-containing resin film 35 is labeled to the reverse side 2c of the semiconductor chip 2. The present invention may be worked through combination of all these three features or through use of only one. In other respects, the fourth embodiment is equal in configuration to the first through third embodiments.

There will be described a deuterium-containing resin material used for the semiconductor device 1c according to the fourth embodiment shown in FIG. 9, by reference to FIGS. 10A and 10B. FIG. 10A shows a chemical formula of $C_2D_5$ having hydrogen H substituted for deuterium D which is used, in place of $C_2H_5$, for an alkyl group contained in the polyimide resin constituting the insulating substrate 8 and the carrier film 6. FIG. 10B shows a chemical formula of $CD_3$ having hydrogen H substituted for deuterium D which is used in place of $CH_3$ of bisphenol A contained in the epoxy resin constituting the sealing material 11 and the package 12.

As mentioned above, not only polyimide resin or epoxy resin but also common resins contain a lot of hydrogen atoms. Even if hydrogen atoms H are substituted for deuterium D which is an isotope of the hydrogen atom, both the resin containing hydrogen atoms and the deuterium-containing resin are completely equal to each other in terms of chemical properties and react in completely the same manner. The inventor has paid attention to such features and has acknowledged that a deuterium-containing polyimide or epoxy resin can be manufactured by means of substantially the same method.

The scattering of neutrons by the deuterium-containing resin material used for the semiconductor device ic according to the fourth embodiment shown in FIG. 9 will now be described by reference to FIGS. 11A and 11B. Neutrons are decelerated through a scattering process. Deuterium having a large scattering cross section and a considerably small absorption cross section is a superior neutron moderator. As shown in FIG. 11B, the scattering cross section of neutrons that are currently passing through deuterium abruptly increases as the neutron energy decreases. FIG. 11A shows a simulation result related to the neutron shielding capability of deuterium calculated on the basis of such a relationship.

As described above, the semiconductor device 1c according to the fourth embodiment is characterized by any one of the insulating substrate 38, the carrier film 36, the sealing material 31, the resin package 32, and the resin film 35 to be labeled to the reverse side of the semiconductor chip 2 being formed from deuterium-containing polyimide or epoxy resin which hinders passage of neutrons.

The present invention has the foregoing configurations, and the effects and advantageous of the present invention may be summarized as follows.

According to a first aspect of the present invention, a stress alleviation film is bonded to a marginal portion of a semiconductor chip having the maximum stress distribution density, and hence the stress exerted on the semiconductor chip is alleviated. Further, shielding electrodes are provided in a marginal area of an insulating substrate having the maximum stress distribution density, and hence there is alleviated the stress exerted on signal electrodes provided in the center area of the insulating. As a result, the reliability of electrical connection between the semiconductor chip and a motherboard can be significantly improved.

According to a second aspect of the present invention, since a shielding layer embedded in the stress alleviation film shields chip electrodes from close range, and the shielding electrodes shield the signal electrodes. Hence, noise reduction and prevention of cross-talk between external signals and the signal electrodes can be achieved.

According to a third aspect of the present invention, mutual connection matching the requirements of both the motherboard and the semiconductor chip can be achieved by switching internal circuits in the assemble.

According to a fourth aspect of the present invention, each of the signal and shielding electrodes is coaxially shielded, and hence there can be prevented cross-talk among the signal electrodes as well as cross-talk between external signals and the signal electrodes. Particularly, the structure in which each of the angular signal electrodes and each of the shielding electrodes is coaxially shielded by means of a rectangular shielding layer array provides a high area utilization factor and renders a semiconductor chip and a semiconductor package compact.

According to a fifth aspect of the present invention, external electrodes are formed into solder bumps which protrude from the major surface of the insulating substrate. Accordingly, the external electrodes have a high degree of versatility and facilitate connection of the semiconductor chip to the motherboard.

According to a sixth aspect of the present invention, the external electrodes are formed into electrode pads which do not protrude from the major surface of the insulating substrate. Accordingly, the external electrodes have high signal transmission reliability and can more effectively prevent cross-talk among the signal electrodes.

According to a seventh aspect of the present invention, the heat produced by the semiconductor chip can be efficiently dissipated although the package is equal in size to the semiconductor chip, and hence the reliability of long-term operation of the semiconductor device can be improved.

According to an eighth aspect of the present invention, the semiconductor device can be used in an environment where the device is subjected to incoming neutrons and can prevent soft-error failures, which would otherwise be caused by passage of neutrons.

According to a ninth aspect of the present invention, a rectangularly-outlined or annular stress alleviation film can have a shielding layer embedded therein. Therefore, cross-talk can be prevented. Further, a cross-shaped stress alleviation film improves the flow of sealing material into a gap between the semiconductor chip and the stress alleviation film, thus improving sealing reliability.

Obviously many modifications and variations of the present invention are possible in the light of the above teachings. It is therefore to be understood that within the scope of the appended claims the invention may by practiced otherwise than as specifically described.

What is claimed is:

1. A semiconductor device comprising:
   a semiconductor chip in which circuit elements are formed on the major surface thereof, said semiconductor chip being provided with chip electrodes on the major surface thereof;
   an insulating substrate having a major surface to face a motherboard and a reverse surface to receive said semiconductor chip;
   signal electrodes arranged in a grid array on the major surface of said insulating substrate, said signal electrodes being electrically connected to said chip electrodes of said semiconductor chip;
   shielding electrodes arranged on a marginal area of the major surface of said insulating substrate to surround said signal electrodes;
   a stress alleviation film disposed between a marginal portion of the major surface of said semiconductor chip and a marginal portion of the reverse surface of said insulating substrate;
   sealing material hermetically sealing a clearance between the major surface of said semiconductor chip and the reverse surface of said insulating substrate; and
   a package hermetically housing said sealed semiconductor chip, stress alleviation film, and insulating substrate,
   wherein said signal and shielding electrodes provided on the major surface of said insulating substrate may be connected to electrodes of a motherboard.

2. The semiconductor device as defined in claim 1, wherein said stress alleviation film includes therein a shielding layer which is connected to a shielding electrodes on the major surface of said insulating substrate.

3. The semiconductor device as defined in claim 1, wherein said insulating substrate comprises, on the reverse side thereof, a carrier film which includes an internal circuit capable of switching electrical connection between said chip electrodes of said semiconductor chip and said signal electrodes or said shielding electrodes of said insulating substrate.

4. The semiconductor device as defined in claim 1, wherein said insulating substrate comprises therein a shielding member which coaxially surrounds each of said signal electrodes and shielding electrodes provided on the major surface of said insulating substrate.

5. The semiconductor device as defined in claim 1, wherein said signal electrodes and shielding electrodes provided on the major surface of said insulating substrate are formed from solder bumps protruding from the major surface of said insulating substrate.

6. The semiconductor device as defined in claim 1, wherein said signal electrodes and shielding electrodes provided on the major surface of said insulating substrate are formed from electrode pads which do not protrude from the major surface of said insulating substrate.

7. The semiconductor device as defined in claim 1, wherein said package is provided with a heat sink.

8. The semiconductor device as defined in claim 1, wherein at least one of said insulating substrate, carrier film, sealing material, package, and a film to be labeled on the reverse side of said semiconductor chip is formed from deuterium-containing resin material.

9. The semiconductor device as defined in claim 1, wherein said stress alleviation film assumes an outlined rectangular shape, an annular shape, or a cross shape.

* * * * *